United States Patent
Hu

(10) Patent No.: US 8,222,080 B2
(45) Date of Patent: Jul. 17, 2012

(54) FABRICATION METHOD OF PACKAGE STRUCTURE

(75) Inventor: Chu-Chin Hu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 148 days.

(21) Appl. No.: 12/871,447

(22) Filed: Aug. 30, 2010

(65) Prior Publication Data
US 2011/0053318 A1    Mar. 3, 2011

(30) Foreign Application Priority Data
Sep. 2, 2009  (TW) ................................ 98129496 A

(51) Int. Cl.
*H01L 21/50* (2006.01)
(52) U.S. Cl. .. 438/108; 438/113; 438/107; 257/E21.499
(58) Field of Classification Search ................ 438/108, 438/107, 112, 113; 257/E21.499, E21.503
See application file for complete search history.

(56) References Cited

U.S. PATENT DOCUMENTS

| | | | | |
|---|---|---|---|---|
| 2009/0072384 A1* | 3/2009 | Wong et al. | .................. | 257/712 |
| 2009/0140442 A1* | 6/2009 | Lin | ................................ | 257/778 |
| 2009/0155959 A1* | 6/2009 | Lin et al. | ........................ | 438/124 |
| 2010/0019368 A1* | 1/2010 | Shin | .............................. | 257/686 |

* cited by examiner

*Primary Examiner* — Michael Trinh
(74) *Attorney, Agent, or Firm* — Edwards Wildman Palmer LLP; Peter F. Corless; Steven M. Jensen

(57) ABSTRACT

Provided is a fabrication method of a package structure, including cutting a full-panel packaging substrate into a plurality of packaging substrate blocks, each of which has a plurality of packaging substrate units; mounting and packaging a semiconductor chip on each of the packaging substrate units and securing and protecting the semiconductor chips with an encapsulating material, thereby forming a plurality of packaging substrate blocks with packaging substrate units; and cutting the packaging substrate blocks to separate the packaging substrate units from each other. In the fabrication process, the alignment error between packaging substrate units in each packaging substrate block can be reduced by cutting the packaging substrate into packaging substrate blocks of appropriate size, thereby increasing the yield, and also the packaging of the semiconductor chips can be performed at the same time on all packaging substrate units in each substrate block so as to integrate fabrication of substrates with the packaging of semiconductor chips to simplify fabrication steps, thus increasing the productivity and reducing fabrication costs.

11 Claims, 7 Drawing Sheets

FABRICATION METHOD OF PACKAGE STRUCTURE

CROSS-REFERENCES TO RELATED APPLICATIONS

This application claims under 35 U.S.C. §119(a) the benefit of Taiwanese Application No. 098129496 filed Sep. 2, 2009, the entire contents of which is incorporated herein by reference.

BACKGROUND OF THE INVENTION

1. Field of the Invention

The present invention relates generally to fabrication methods of package structures, and more particularly, to a fabrication method of a package structure capable of increasing productivity and reducing fabrication costs.

2. Description of Related Art

In flip chip packaging technology, a semiconductor chip has a plurality of electrode pads formed on an active surface thereof, a substrate has a plurality of conductive pads formed on a surface thereof and corresponding in position to the electrode pads, and the electrode pads and the corresponding conductive pads are electrically connected by a plurality of solder bumps.

Compared with conventional wire bonding technology that establishes electrical connection between a semiconductor chip and a substrate through gold wires, flip chip packaging technology increases the circuit layout density, reduces the overall package size, decreases the impedance, and enhances the electrical performance of the package by dispensing with gold wires.

Conventionally, the fabrication method of a flip chip package structure comprises: providing a core board; forming sequentially on the core board a built-up structure with a plurality of bump pads and an insulating protective layer disposed therein with a plurality of openings for exposing the bump pads therefrom, followed by forming a surface treatment layer on the bump pads so as to form a full-panel packaging substrate; cutting the full-panel packaging substrate into a plurality of packaging substrate units or a plurality of strips, each of which comprises a plurality of packaging substrate units; and finally sending the packaging substrate units or strips to packaging factories for chip mounting, packaging and/or singulation.

If the full-panel packaging substrate is cut into a plurality of packaging substrate units, the chip mounting and packaging processes can only be performed on a single substrate unit at a time, thereby reducing productivity and increasing costs. Where the full-panel packaging substrate is cut into a plurality of substrate strips, and the frame of the substrate strips occupies a large effective area, thereby resulting in an increase in costs and a waste of materials. Furthermore, with packaging substrates becoming thinner, it is increasingly difficult to perform chip mounting or packaging on a substrate unit or strip.

On the other hand, if the chip mounting, packaging and singulation processes are directly performed on a full-panel packaging substrate, large-scale machines must be used, thereby increasing the equipment cost. Furthermore, alignment of a large-area packaging substrate is seldom accurate to thereby cause great errors in finally formed packaging substrate units, thus adversely affecting the product yield.

Therefore, it is imperative to overcome the above drawbacks of the prior art.

SUMMARY OF THE INVENTION

In view of the above drawbacks of the prior art, the present invention provides a fabrication method of a package structure so as to increase the productivity and reduce fabrication costs.

In order to achieve the above and other objectives, the present invention discloses a fabrication method of a package structure, comprising the steps of: providing a full-panel packaging substrate having top-bottom symmetry, a plurality of metal bumps and an insulating protective layer being formed on the two opposing surfaces of the packaging substrate and the insulating protective layer having a plurality of openings formed therein for exposing the metal bumps therefrom; splitting the full-panel packaging substrate having top-bottom symmetry and cutting the full-panel packaging substrate into a plurality of packaging substrate blocks, wherein each of the packaging substrate blocks comprises a plurality of packaging substrate units arranged in an m×n array, m and n being integers greater than 1; mounting each of the packaging substrate blocks to a respective second carrier board; mounting a semiconductor chip to each of the packaging substrate units, wherein each of the semiconductor chips has a plurality of electrode pads on the active surface thereof, and the electrode pads are electrically connected to the metal bumps, respectively, through a solder material; forming an encapsulating material on the insulating protective layer and the semiconductor chips, and filling the encapsulating material between the semiconductor chips and the insulating protective layer so as to encapsulate the solder material; removing the second carrier board; and cutting each of the packaging substrate blocks mounted thereon with the semiconductor chips so as to separate the packaging substrate units from each other.

The full-panel packaging substrate is fabricated by following the steps of: providing a first carrier board with a releasing layer formed on the two opposing surfaces of the first carrier board and having an area less than the first carrier board, an adhesive layer formed on the first carrier board and along the periphery of the releasing film, and a metal layer formed on the releasing layer and the adhesive layer; forming sequentially a plurality of conductive pads and a built-up structure on the metal layer, wherein the built-up structure comprises at least a dielectric layer, a wiring layer formed on the dielectric layer, and a plurality of conductive vias formed in the dielectric layer and electrically connecting the wiring layer and the conductive pads, and the wiring layer disposed on the outermost portion of the built-up structure comprises a plurality of bump pads; and forming an insulating protective layer on the outermost portion of the built-up structure, forming a plurality of openings in the insulating protective layer so as to expose the bump pads therefrom, followed by forming the metal bumps on the bump pads, respectively, by electroplating.

The packaging substrate blocks are fabricated by following the steps of: cutting the full-panel packaging substrate having top-bottom symmetry along cutting lines thereof, the cutting lines passing through the releasing layer; removing the first carrier board and the releasing layer so as to form two full-panel packaging substrates separate and independent from each other; and cutting the full-panel packaging substrates and removing the metal layer so as to form the packaging substrate blocks.

The method further comprises the step of forming solder balls on the conductive pads of the packaging substrate blocks after removing the second carrier board.

Also, the method further comprises the steps of forming a protective film on the insulating protective layer and the metal bumps before cutting the full-panel packaging substrate, and removing the protective film after completing the cutting process.

The present invention further discloses another fabrication method of a package structure, comprising the steps of: providing a full-panel packaging substrate having top-bottom symmetry, a plurality of bump pads and an insulating protective layer being formed on the two opposing surfaces of the full-panel packaging substrate, and the insulating protective layer having a plurality of openings formed therein so as to expose the bump pads therefrom; splitting the full-panel packaging substrate having top-bottom symmetry and cutting the full-panel packaging substrate into a plurality of packaging substrate blocks, wherein each of the packaging substrate blocks comprises a plurality of packaging substrate units arranged in an m×n array, m and n being integers greater than 1; mounting each of the packaging substrate blocks to a respective second carrier board; forming solder bumps on the bump pads, respectively; mounting a semiconductor chip to each of the packaging substrate units, wherein each of the semiconductor chips has a plurality of electrode pads on the active surface thereof, and the electrode pads are electrically connected to the bump pads through the solder bumps, respectively; forming an encapsulating material on the insulating protective layer and the semiconductor chips, and filling the encapsulating material between the semiconductor chips and the insulating protective layer so as to encapsulate the solder bumps; removing the second carrier board; and cutting each of the packaging substrate blocks mounted thereon with the semiconductor chips so as to separate the packaging substrate units from each other.

The full-panel packaging substrate is fabricated by following the steps of: providing a first carrier board with a releasing layer formed on the two opposing surfaces of the first carrier board and having an area less than the first carrier board, an adhesive layer formed on the first carrier board and along the periphery of the releasing film, and a metal layer formed on the releasing layer and the adhesive layer; forming sequentially a plurality of conductive pads and a built-up structure on the metal layer, wherein the built-up structure comprises at least a dielectric layer, a wiring layer formed on the dielectric layer, and a plurality of conductive vias formed in the dielectric layer and electrically connecting the wiring layer and the conductive pads, and the wiring layer disposed on the outermost portion of the built-up structure comprises a plurality of bump pads; and forming an insulating protective layer on the outermost portion of the built-up structure, followed by forming a plurality of openings in the insulating protective layer so as to expose the bump pads therefrom.

The packaging substrate blocks are fabricated by following the steps of: cutting the full-panel packaging substrate having top-bottom symmetry along cutting lines thereof, the cutting lines passing through the releasing layer; removing the first carrier board and the releasing layer so as to form two full-panel packaging substrates separate and independent from each other; and cutting the full-panel packaging substrates and removing the metal layer so as to form the packaging substrate blocks.

The method further comprises the step of forming solder balls on the conductive pads of the packaging substrate blocks after removing the second carrier board. The solder bumps are formed by printing or ball mounting, followed by reflow soldering.

The method further comprises the steps of forming a protective film on the insulating protective layer and the bump pads before cutting the full-panel packaging substrate, and removing the protective film after completing the cutting process.

Therefore, the method of the present invention comprises the steps of: cutting a full-panel packaging substrate into a plurality of packaging substrate blocks, wherein each of the packaging substrate blocks has an appropriate area and comprises a plurality of packaging substrate units so as to dispense with the need for large scale machines and reduce costs; mounting a semiconductor chip to each of the packaging substrate units and forming an encapsulating material to encapsulate the semiconductor chip so as to secure and protect the semiconductor chip; and cutting the packaging substrate blocks to separate the packaging substrate units from each other. Compared with the prior art, the present method integrates the fabrication of packaging substrates with the packaging of semiconductor chips such that the semiconductor chip packaging process can be performed to all the packaging substrate units in each of the packaging substrate blocks at the same time, thereby simplifying the fabrication steps and increasing productivity. Furthermore, since the packaging substrate blocks have an appropriate area, the alignment error between the packaging substrate units in each of the packaging substrate blocks can be reduced, thereby increasing the process accuracy and product yield. Therefore, the present invention has the advantages of high productivity and yield.

DETAILED DESCRIPTION OF PREFERRED EMBODIMENTS

The following illustrative embodiments are provided to illustrate the disclosure of the present invention, these and other advantages and effects being apparent to those in the art after reading this specification.

First Embodiment

Figure 1A:
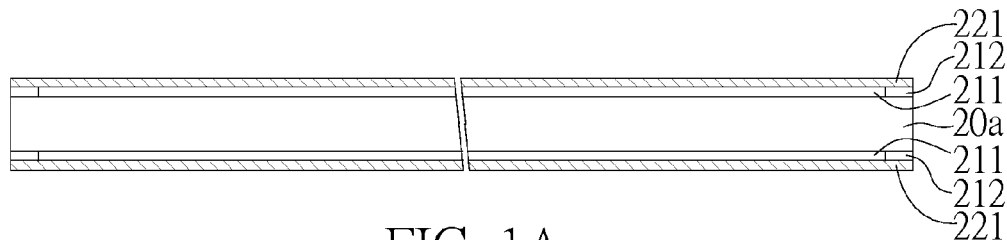
FIGS. 1A to 1H are cross-sectional views showing a fabrication method of a package structure according to a first embodiment of the present invention, wherein FIG. 1E' is the top view of the structure of FIG. 1E.
Figure 1B:
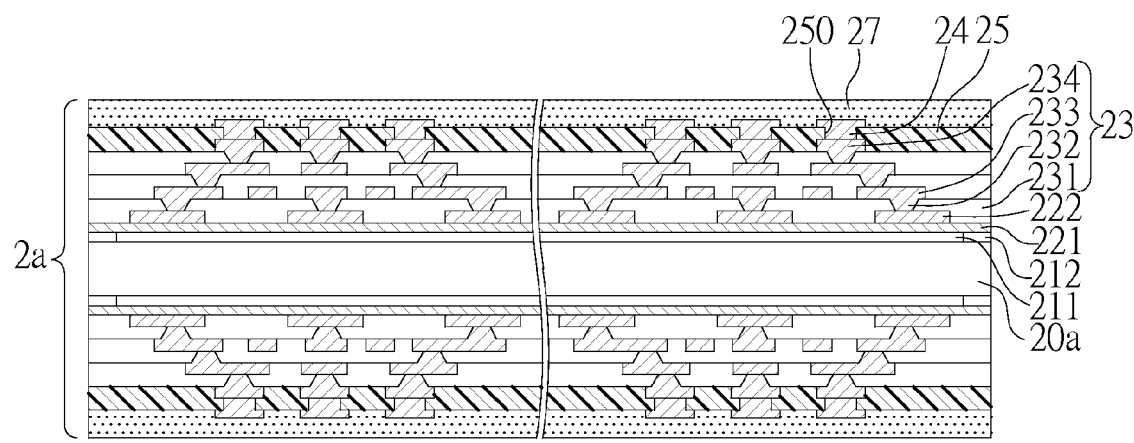
Figure 1C:
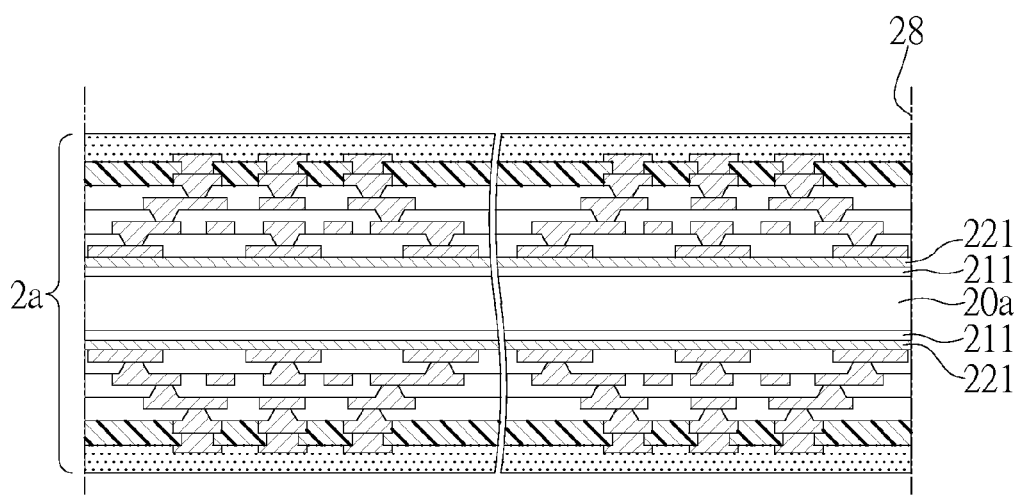
Figure 1D:
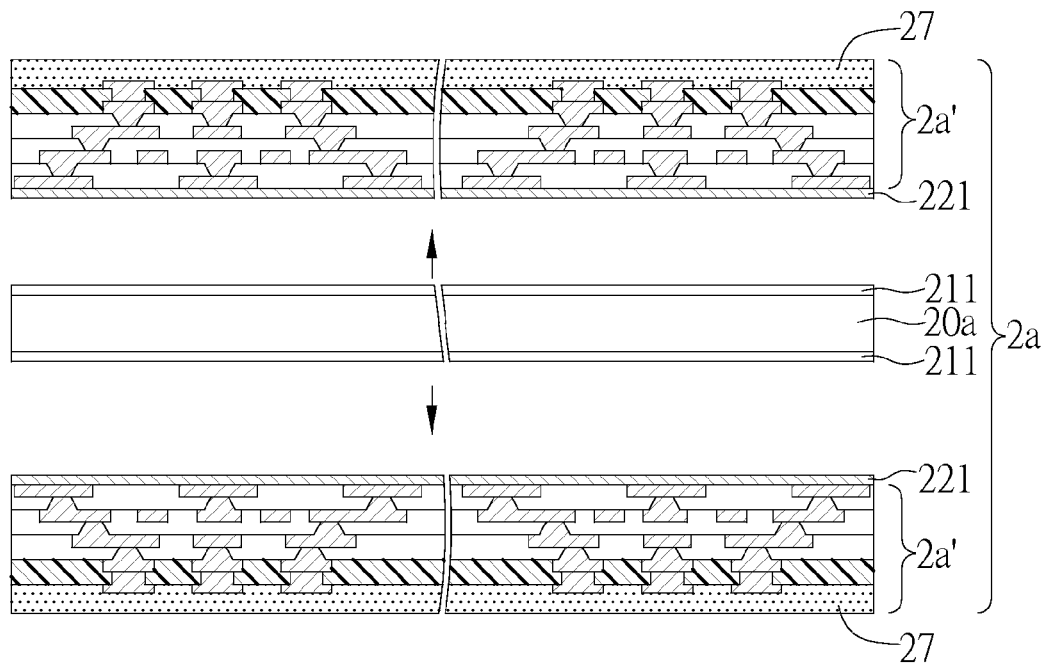
Figure 1E:
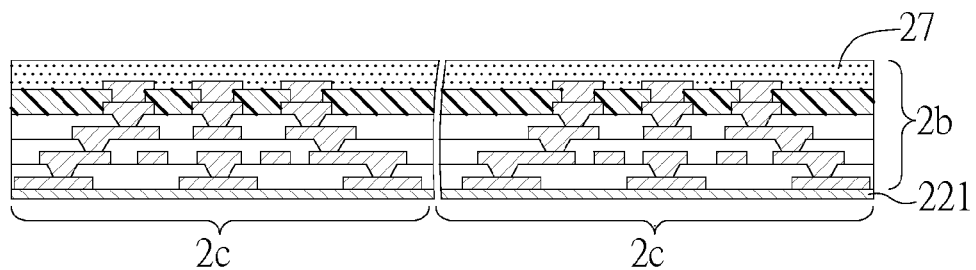
Figure 1E:
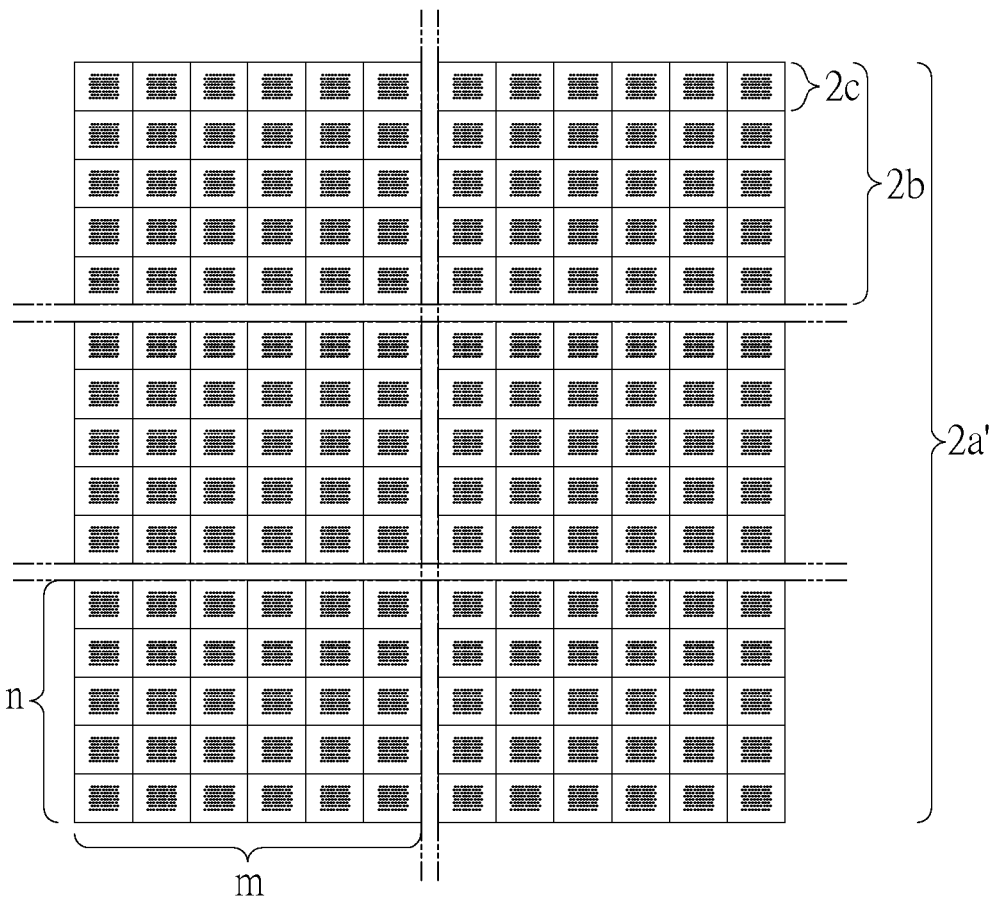

FIGS. 1A to 1H are cross-sectional views showing a fabrication method of a package structure according to a first embodiment of the present invention, wherein FIG. 1E' is the top view of the structure of FIG. 1E.

Referring to FIG. 1A, a first carrier board 20a is provided, and a releasing layer 211 is formed on the two opposing surfaces of the first carrier board 20a such that the area of the releasing layer 211 is of an area less than the first carrier board 20a. An adhesive layer 212 is formed on the first carrier board 20a and along the periphery of the releasing layer 211, and a metal layer 221 is formed on the releasing layer 211 and the adhesive layer 212, wherein the releasing layer 211 is a releasing film, the metal layer 221 is made of copper and used as a seed layer in an electroplating process.

Referring to FIG. 1B, a plurality of conductive pads 222 and a built-up structure 23 are sequentially formed on the metal layer 221 on the two opposing surfaces of the first carrier board 20a, wherein the built-up structure 23 comprises at least a dielectric layer 231, a wiring layer 233 formed on the dielectric layer 231, and a plurality of conductive vias 232 formed in the dielectric layer 231 and electrically connecting the wiring layer 233 and the conductive pads 222, the wiring layer 233 comprising a plurality of bump pads 234. Further, an insulating protective layer 25 is formed on the outermost portion of the built-up structure 23, and a plurality of openings 250 is formed in the insulating protective layer 25 corresponding in position to the bump pads 234 so as to expose the bump pads 234 from the openings 250. Subsequently, metal bumps 24 made of a material such as copper are formed on the bump pads 234 by electroplating. Thus, a full-panel packaging substrate 2a having top-bottom symmetry is obtained. A protective film 27 can further be formed on the insulating protective layer 25 and the metal bumps 24.

Referring to FIG. 1C, the full-panel packaging substrate 2a having top-bottom symmetry is cut for the first time along a cutting line 28 passing through the releasing film 211, thereby removing the adhesive layer 212.

Referring to FIG. 1D, the first carrier board 20a and the releasing film 211 are removed such that the full-panel packaging substrate 2a having top-bottom symmetry is split into two full-panel packaging substrates 2a' which are separate and independent from each other.

Referring to FIGS. 1E and 1E', wherein FIG. 1E' is the top view of the structure of FIG. 1E, each of the full-panel packaging substrates 2a' is cut for the second time so as to form a plurality of packaging substrate blocks 2b, wherein each of the packaging substrate blocks 2b comprises a plurality of packaging substrate units 2c arranged in an m×n array, wherein m and n are integers greater than 1. In the present embodiment, m is 6, and n is 5, but they are not limited thereto.

Figure 1F:
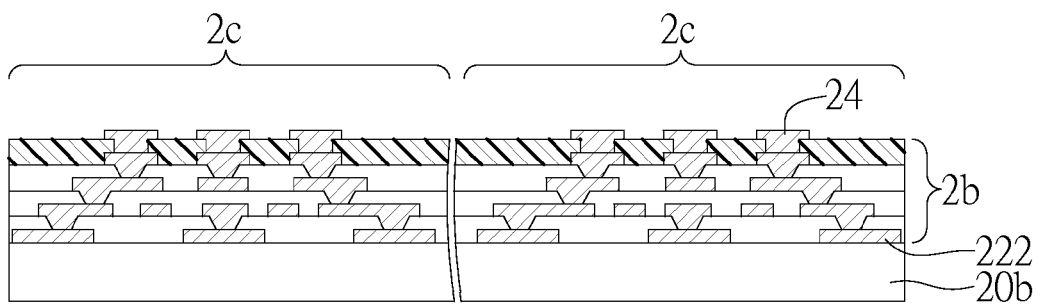
Figure 1G:
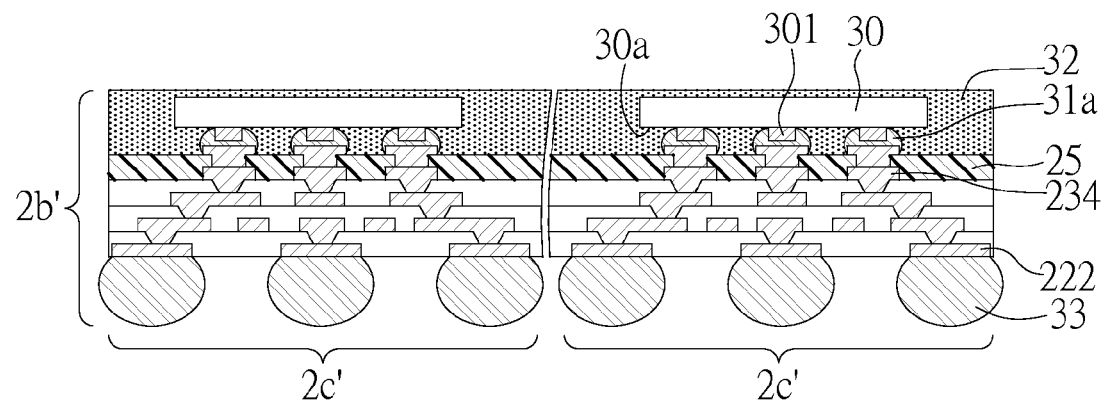

Referring to FIG. 1F, the protective film 27 and the metal layer 221 are removed and each of the packaging substrate blocks 2b is mounted on a respective second carrier board 20b with the conductive pads 222 disposed on the second carrier board 20b. Referring to FIG. 1G a semiconductor chip 30 is mounted on the metal bumps 24 of each of the packaging substrate units 2c, wherein the semiconductor chips 30 each have a plurality of electrode pads 301 formed on the active surface 30a thereof, and the electrode pads 301 are electrically connected to the metal bumps 24, respectively, by a solder material 31a. Then, an encapsulating material 32 is formed on the insulating protective layer 25 and the semiconductor chips 30 and filled between the semiconductor chips 30 and the insulating protective layer 25 to encapsulate the solder material 31a. Then, the second carrier board 20b is removed to expose the conductive pads 222. Subsequently, solder balls 33 can be formed on the conductive pads 222. Alternatively, the conductive pads 222 can be directly used for electrical connection with an LGA (land grid array) structure (not shown).

Figure 1H:
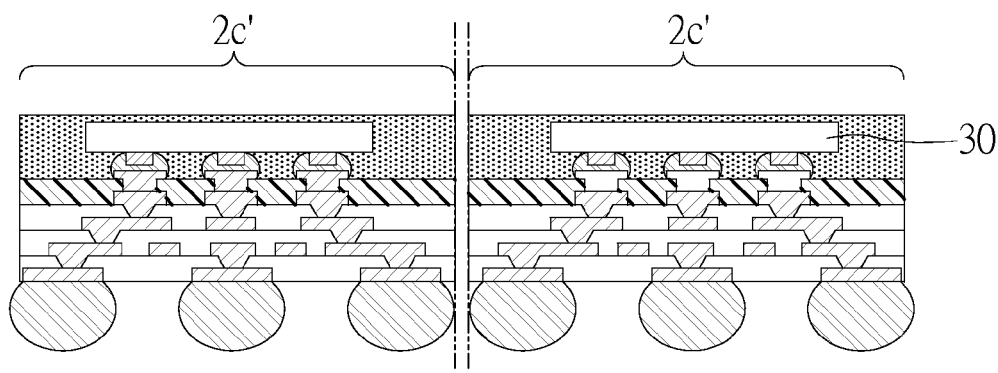

Referring to FIG. 1H, each of the package structure blocks 2b' mounted thereon with the semiconductor chips 30 is cut for the third time such that the package structure units 2c' are separated from each other.

Second Embodiment

FIGS. 2A to 2H are cross-sectional views showing a fabrication method of a package structure according to a second embodiment of the present invention.

Figure 2A:
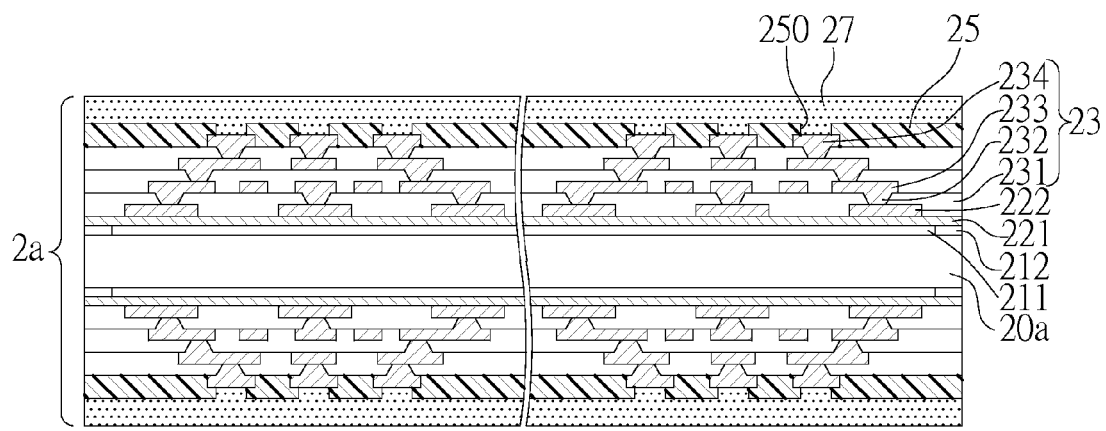
FIGS. 2A to 2H are cross-sectional views showing a fabrication method of a package structure according to a second embodiment of the present invention.

Referring to FIG. 2A, a first carrier board 20a is provided, a releasing layer 211 is formed on the two opposing surfaces of the first carrier board 20a and has an area less than that of the first carrier board 20a, an adhesive layer 212 is formed on the first carrier board 20a around the releasing layer 211, and a metal layer 221 is formed on the releasing layer 211 and the adhesive layer 212, wherein the releasing layer 211 is a releasing film, and the metal layer 221 is made of copper and used as a seed layer in an electroplating process. Subsequently, a plurality of conductive pads 222 and a built-up structure 23 are sequentially formed on the metal layer 221 on the two opposing surfaces of the first carrier board 20a, wherein the built-up structure 23 comprises at least a dielectric layer 231, a wiring layer 233 formed on the dielectric layer 231, and a plurality of conductive vias 232 formed in the dielectric layer 231 and electrically connecting the wiring layer 233 and the conductive pads 222, and the wiring layer 233 comprises a plurality of bump pads 234. Further, an insulating protective layer 25 is formed on the outermost portion of the built-up structure 23, and a plurality of openings 250 is formed in the insulating protective layer 25 corresponding in position to the bump pads 234 so as to expose the bump pads 234 from the insulating protective layer 25. Thus, a full-panel packaging substrate 2a with top-bottom symmetry is obtained. A protective film 27 can further be formed on the insulating protective layer 25 and the bump pads 234.

Figure 2B:
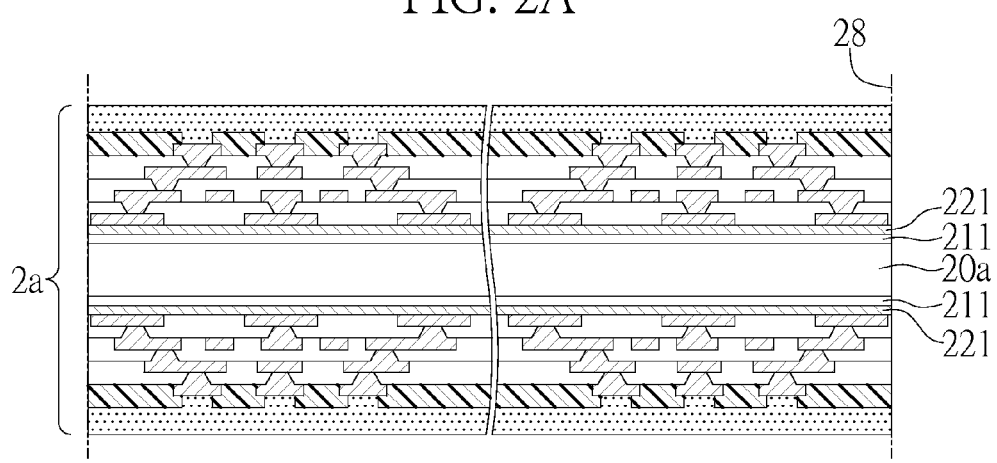

Referring to FIG. 2B, the full-panel packaging substrate 2a with top-bottom symmetry is cut for the first time along a cutting line 28 passing through the releasing film 211, thereby removing the adhesive layer 212.

Figure 2C:
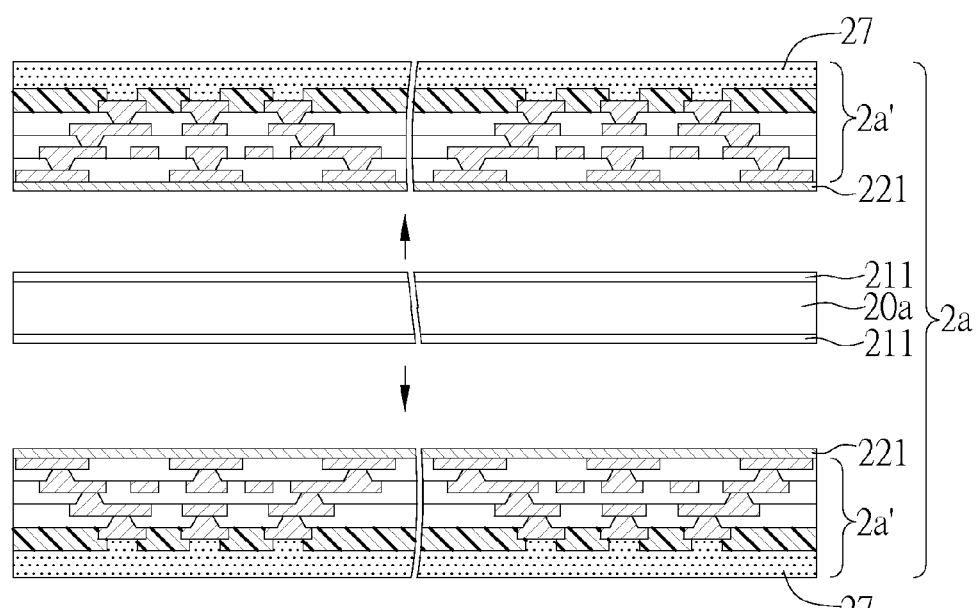

Referring to FIG. 2C, the first carrier board 20a and the releasing film 211 are removed such that the full-panel packaging substrate 2a having top-bottom symmetry is split into two full-panel packaging substrates 2a' which are separate and independent from each other.

Figure 2D:
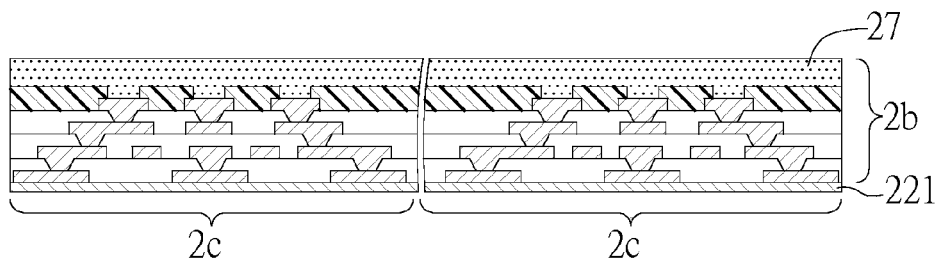

Referring to FIG. 2D, each of the full-panel packaging substrates 2a' is cut for a second time so as to form a plurality of packaging substrate blocks 2b, wherein each of the packaging substrate blocks 2b comprises a plurality of packaging substrate units 2c arranged in an m×n array, wherein m and n are integers greater than 1

Figure 2E:
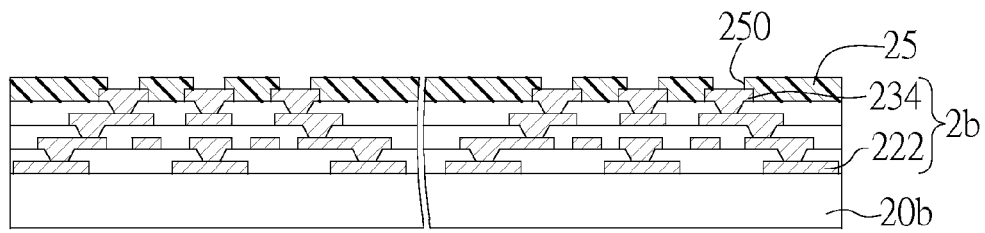

Referring to FIG. 2E, the protective film 27 and the metal layer 221 are removed, and each of the packaging substrate blocks 2b is mounted on a respective second carrier board 20b with the conductive pads 222 disposed on the second carrier board 20b.

Figure 2F:
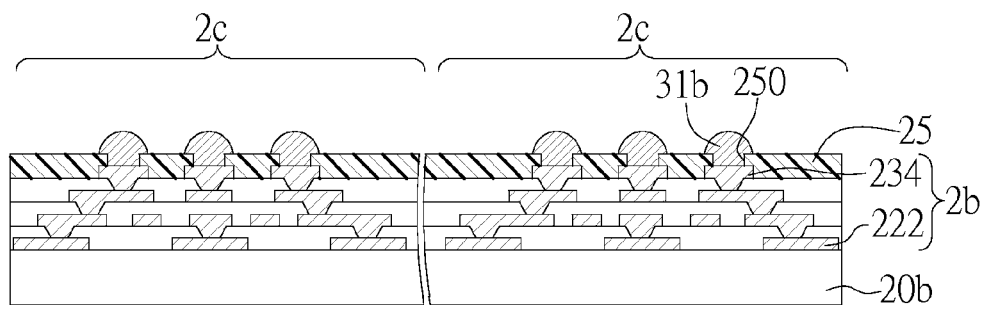

Referring to FIG. 2F, a plurality of solder bumps 31b is formed on the bump pads 234 exposed from the openings 250 of the insulating protective layer 25, respectively, by printing or ball mounting, followed by reflow soldering.

Figure 2G:
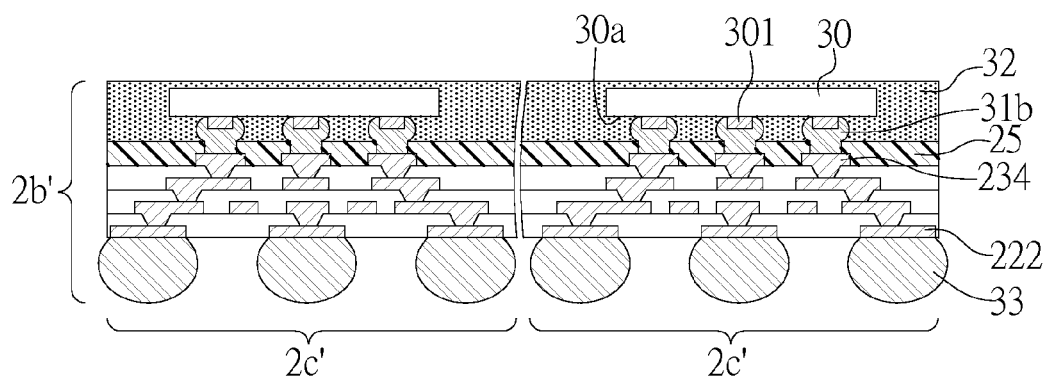

Referring to FIG. 2G, a semiconductor chip 30 is mounted on the bump pads 234 of each of the packaging substrate units 2c so as to form the package structure blocks 2b' of the package structure units 2c'. Each of the semiconductor chips 30 has the active surface 30a formed thereon with a plurality of electrode pads 301. The electrode pads 301 are electrically connected to the bump pads 234 through the solder bumps 31b, respectively. Then, an encapsulating material 32 is formed on the insulating protective layer 25 and the semiconductor chips 30 and filled between the insulating protective layer 25 and the semiconductor chips 30 to encapsulate the solder bumps 31b. Subsequently, the second carrier board 20b is removed to expose the conductive pads 222. Then, solder balls 33 are formed on the conductive pads 222, respectively. Alternatively, the conductive pads 222 are directly used for electrical connection with an LGA structure (not shown) but are not formed thereon with the solder balls 33.

Figure 2H:
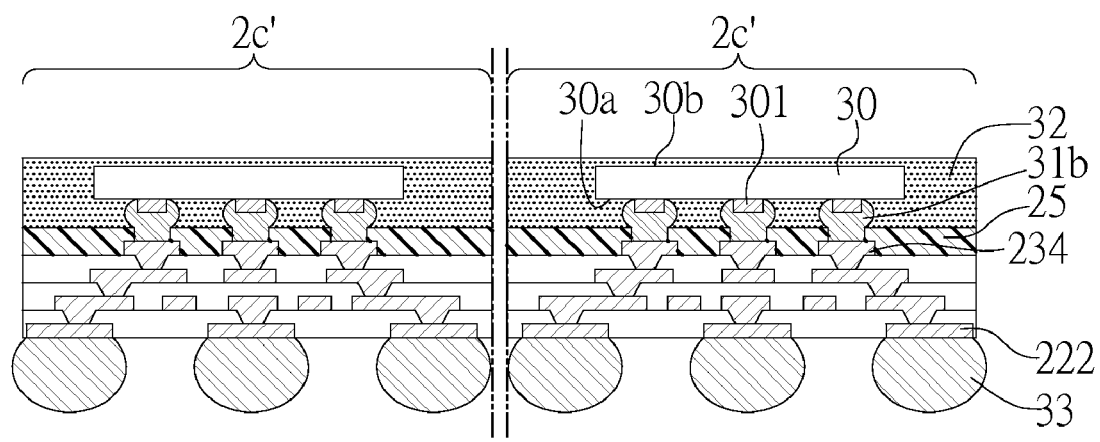

Referring to FIG. 2H, each of the package structure blocks 2b' mounted thereon with the semiconductor chips 30 is cut for a third time such that the package structure units 2c' thereof are separated from each other.

It should be noted that the full-panel packaging substrate having top-bottom symmetry can also be cut into a plurality of packaging substrate blocks each having top-bottom symmetry, and then each of the packaging substrate blocks is split into two packaging substrate blocks separate and independent from each other.

Therefore, the present invention comprises: cutting a full-panel packaging substrate into a plurality of packaging substrate blocks, wherein each of the packaging substrate blocks has an appropriate area and comprises a plurality of packaging substrate units so as to dispense with the need for large scale machines and reduce costs; mounting a semiconductor chip to each of the packaging substrate units, followed by forming an encapsulating material to encapsulate the semiconductor chip so as to secure and protect the semiconductor chip; and cutting the packaging substrate blocks to separate the packaging substrate units from each other. Compared with the prior art, the present method integrates the fabrication of packaging substrates with the packaging of semiconductor chips such that the semiconductor chip packaging process can be performed to all the packaging substrate units in each of the packaging substrate blocks at the same time, thereby simplifying the fabrication steps and increasing productivity. Furthermore, since the packaging substrate blocks have an appropriate area, the alignment error between the packaging substrate units in each of the packaging substrate blocks can be reduced during a fabrication process, thereby increasing the process accuracy and product yield. Therefore, the present invention has the advantages of high productivity and high yield.

The above-described descriptions of the detailed embodiments are provided to illustrate the preferred implementation according to the present invention, but are not intended to limit the scope of the present invention. Accordingly, many modifications and variations completed by those with ordinary skill in the art will fall within the scope of present invention as defined by the appended claims.

What is claimed is:

1. A fabrication method of a package structure, comprising the steps of:
    providing a full-panel packaging substrate having top-bottom symmetry and two opposing outmost layers each formed thereon with a plurality of metal bumps and an insulating protective layer formed therein with a plurality of openings for exposing the metal bumps, respectively;
    splitting the full-panel packaging substrate having top-bottom symmetry, followed by cutting the full-panel packaging substrate into a plurality of packaging substrate blocks each comprising a plurality of packaging substrate units arranged in an m×n array, wherein m and n are integers greater than 1;
    mounting each of the packaging substrate blocks on a respective second carrier board;
    mounting a semiconductor chip on each of the packaging substrate units, the semiconductor chips each having an active surface provided thereon with a plurality of electrode pads electrically connected to the metal bumps, respectively, through a solder material;
    forming an encapsulating material on the insulating protective layer and the semiconductor chips, followed by filling the encapsulating material between the insulating protective layer and the semiconductor chips so as to encapsulate the solder material;
    removing the second carrier board; and
    cutting each of the packaging substrate blocks mounted thereon with the semiconductor chips so as to separate the packaging substrate units from each other.

2. The method of claim 1, wherein the full-panel packaging substrate having top-bottom symmetry is fabricated by following the steps of:
    providing a first carrier board having two opposing surfaces provided thereon with a releasing layer of an area less than the first carrier board, an adhesive layer formed on the first carrier board and along a periphery of the releasing film, and a metal layer formed on the releasing layer and the adhesive layer;
    forming sequentially a plurality of conductive pads and a built-up structure on the metal layer, the built-up structure comprising at least a dielectric layer, a wiring layer formed on the dielectric layer, and a plurality of conductive vias formed in the dielectric layer and electrically connecting the wiring layer and the conductive pads, wherein the wiring layer disposed on an outermost portion of the built-up structure has a plurality of bump pads; and
    forming the insulating protective layer on the outermost portion of the built-up structure, the insulating protective layer having the openings so as for the bump pads to be exposed therefrom, respectively, followed by forming the metal bumps on the bump pads, respectively, by electroplating.

3. The method of claim 2, wherein the packaging substrate blocks are fabricated by following the steps of:
    cutting the full-panel packaging substrate having top-bottom symmetry along cutting lines thereof, the cutting lines passing through the releasing layer;
    removing the first carrier board and the releasing layer to thereby allow the full-panel packaging substrate having top-bottom symmetry to become two full-panel packaging substrates separate and independent from each other; and
    cutting the full-panel packaging substrates and removing the metal layer so as to form the packaging substrate blocks.

4. The method of claim 2, further comprising forming solder balls on the conductive pads of the packaging substrate blocks after removing the second carrier board.

5. The method of claim 1, further comprising forming a protective film on the insulating protective layer and the metal bumps before cutting the full-panel packaging substrate, and removing the protective film after completing the cutting process.

6. A fabrication method of a package structure, comprising the steps of:
    providing a full-panel packaging substrate having top-bottom symmetry, two opposing outmost layers each formed thereon with a plurality of bump pads, and an insulating protective layer formed on the opposing outmost layers and the bump pads and formed therein with a plurality of openings for exposing the bump pads, respectively;
    splitting the full-panel packaging substrate having top-bottom symmetry, followed by cutting the full-panel packaging substrate into a plurality of packaging substrate blocks each comprising a plurality of packaging substrate units arranged in an m×n array, wherein m and n are integers greater than 1;

mounting each of the packaging substrate blocks on a respective second carrier board;

forming solder bumps on the bump pads, respectively;

mounting a semiconductor chip on each of the packaging substrate units, the semiconductor chips each having an active surface provided thereon with a plurality of electrode pads electrically connected to the bump pads through the solder bumps, respectively;

forming an encapsulating material on the insulating protective layer and the semiconductor chips, followed by filling the encapsulating material between the semiconductor chips and the insulating protective layer so as to encapsulate the solder bumps;

removing the second carrier board; and cutting each of the packaging substrate blocks mounted thereon with the semiconductor chips so as to separate the packaging substrate units from each other.

7. The method of claim 6, wherein the full-panel packaging substrate having top-bottom symmetry is fabricated by following the steps of:

providing a first carrier board having two opposing surfaces provided thereon with a releasing layer of an area less than the first carrier board, an adhesive layer formed on the first carrier board and along a periphery of the releasing film, and a metal layer formed on the releasing layer and the adhesive layer;

forming sequentially a plurality of conductive pads and a built-up structure on the metal layer, wherein the built-up structure comprises at least a dielectric layer, a wiring layer formed on the dielectric layer, and a plurality of conductive vias formed in the dielectric layer and electrically connecting the wiring layer and the conductive pads, wherein the wiring layer disposed on an outermost portion of the built-up structure has a plurality of bump pads; and forming an insulating protective layer on the outermost portion of the built-up structure, followed by forming in the insulating protective layer a plurality of openings for exposing the bump pads from.

8. The method of claim 7, wherein the packaging substrate blocks are fabricated by following the steps of:

cutting the full-panel packaging substrate having top-bottom symmetry along cutting lines thereof, the cutting lines passing through the releasing layer;

removing the first carrier board and the releasing layer to thereby allow the full-panel packaging substrate having top-bottom symmetry to become two full-panel packaging substrates separate and independent from each other; and cutting the full-panel packaging substrates and removing the metal layer so as to form the packaging substrate blocks.

9. The method of claim 7, further comprising forming solder balls on the conductive pads of the packaging substrate blocks after removing the second carrier board.

10. The method of claim 6, wherein the solder bumps are formed by printing or ball mounting, followed by reflow soldering.

11. The method of claim 6, further comprising forming a protective film on the insulating protective layer and the bump pads before cutting the full-panel packaging substrate, and removing the protective film after completing the cutting process.

* * * * *